(12) United States Patent
Kouvetakis et al.

(10) Patent No.: US 7,598,513 B2
(45) Date of Patent: Oct. 6, 2009

(54) $SI_xSN_yGE_{1-x-y}$ AND RELATED ALLOY HETEROSTRUCTURES BASED ON SI, GE AND SN

(75) Inventors: John Kouvetakis, Mesa, AZ (US); Matthew Bauer, Hillsboro, OR (US); John Tolle, Gilbert, AZ (US)

(73) Assignee: Arizona Board of Regents, Acting for and on behalf of Arizona State University, A Corporate Body Organized under Arizona Law

( * ) Notice: Subject to any disclaimer, the term of this patent is extended or adjusted under 35 U.S.C. 154(b) by 181 days.

(21) Appl. No.: 10/559,979

(22) PCT Filed: Jun. 14, 2004

(86) PCT No.: PCT/US2004/018969

§ 371 (c)(1),
(2), (4) Date: Dec. 8, 2005

(87) PCT Pub. No.: WO2005/015609

PCT Pub. Date: Feb. 17, 2005

(65) Prior Publication Data

US 2006/0163612 A1    Jul. 27, 2006

Related U.S. Application Data

(60) Provisional application No. 60/478,480, filed on Jun. 13, 2003.

(51) Int. Cl.
*H01L 29/06* (2006.01)
*H01L 21/336* (2006.01)

(52) U.S. Cl. .................. 257/14; 257/19; 257/201; 257/616; 257/E31.035; 257/E33.009; 438/285; 438/936; 117/939; 148/DIG. 169

(58) Field of Classification Search .................. 257/14, 257/15, 18, 19, 200, 201, 616, E31.035, E33.009; 438/285, 936; 117/939; 148/DIG. 160, DIG. 169, 148/160

See application file for complete search history.

(56) References Cited

U.S. PATENT DOCUMENTS

4,769,341 A * 9/1988 Luryi .................. 117/105

(Continued)

FOREIGN PATENT DOCUMENTS

JP    63108782 A    5/1988

(Continued)

OTHER PUBLICATIONS

D. W. Jenkins, "Electronic properties of metastable GexSn1-x alloys", Phys. Rev. B., vol. 36, pp. 7994-8001 (1987).

(Continued)

*Primary Examiner*—Howard Weiss
*Assistant Examiner*—Steven H Rao
(74) *Attorney, Agent, or Firm*—McDonnell Boehnen Hulbert & Berghoff LLP

(57) ABSTRACT

A novel method for synthesizing device-quality alloys and ordered phases in a Si—Ge—Sn system uses a UHV-CVD process and reactions of $SnD_4$ with $SiH_3GeH_3$. Using the method, single-phase $Si_xSn_yGe_{1-x-y}$ semiconductors ($x \leq 0.25$, $y \leq 0.11$) are grown on Si via $Ge_{1-x}Sn_x$ buffer layers. The $Ge_{1-x}Sn_x$ buffer layers facilitate heteroepitaxial growth of the $Si_xSn_yGe_{1-x-y}$ films and act as compliant templates that can conform structurally and absorb the differential strain imposed by the more rigid Si and Si—Ge—Sn materials. The $SiH_3GeH_3$ species was prepared using a new and high yield method that provided high purity semiconductor grade material.

26 Claims, 5 Drawing Sheets

U.S. PATENT DOCUMENTS

| | | | | |
|---|---|---|---|---|
| 4,777,023 | A | * | 10/1988 | Fieselmann ................ 423/89 |
| 5,198,387 | A | | 3/1993 | Tang |
| 5,532,183 | A | | 7/1996 | Sugawara |
| 5,548,128 | A | * | 8/1996 | Soref et al. .................. 257/18 |
| 5,714,415 | A | | 2/1998 | Oguro |
| 6,410,434 | B1 | | 6/2002 | Mani |
| 6,441,716 | B1 | | 8/2002 | Doppalapudi et al. |
| 6,723,621 | B1 | | 4/2004 | Cardone et al. |
| 6,888,175 | B1 | * | 5/2005 | Wang et al. ................ 257/103 |
| 6,897,471 | B1 | * | 5/2005 | Soref et al. .................. 257/22 |
| 6,911,084 | B2 | | 6/2005 | Kouvetakis et al. |
| 2003/0157787 | A1 | | 8/2003 | Murthy et al. |
| 2005/0070053 | A1 | * | 3/2005 | Sadaka et al. .............. 438/151 |
| 2006/0134895 | A1 | | 6/2006 | Kouvetakis et al. |
| 2006/0236923 | A1 | | 10/2006 | Kouvetakis et al. |

FOREIGN PATENT DOCUMENTS

| | | |
|---|---|---|
| WO | WO 03/033781 | 4/2003 |
| WO | WO 2004/114368 | 12/2004 |
| WO | WO 2005/001902 | 1/2005 |
| WO | WO 2005/015609 | 2/2005 |
| WO | WO 2006/009171 | 1/2006 |

OTHER PUBLICATIONS

K. A. Mader, "Band structure and instability of GexSn1-x alloys", Solid State Commun., vol. 69(12), pp 1123-1126 (1989).

G. He and H.A. Atwater, "Interband transitions in $Sn_xGe_{1-x}$ Alloys", Phys. Rev. Lett., vol. 79(10), pp. 1937-1940 (1997).

O. Gurdal, R. Desjardins, J. R. A. Carlsson, N. Taylor, H. H. Radamson, J.-E. Sundgren, and J. E. Greene, "Low-temperature growth and critical epitaxial thicknesses of fully strained metastable Ge1-x Snx (x $\leqq$0.26) alloys", J. Appl. Phys., vol. 83(1), pp. 162-170 (1998).

M. T. Asom, E. A. Fitzgerald, A. R. Kortan, B. Spear, and L. C. Kimerling, "Epitaxial Growth of SnGe Alloys", Appl. Phys. Lett., vol. 55(6), pp. 578-580 (1989).

H. Höchst, M. A. Engelhardt, and D. W. Niles, "The MBE growth and electronic structure of $a$-$Sn_xGe_{1-x}$ alloys", SPIE Proceedings, vol. 1106, pp. 165-171 (1989)(Abstract).

C. A. Hoffman, et al., "Three-Band transport and cyclotron resonance in alpha—Sn and alpha—$Sn_{1-x}Ge_x$ grown by molecular-beam epitaxy", Phys. Rev. B. vol. 40(17): pp. 11693-11700, (1989).

W. Wegscheider, K. Eberl, U. Menczigar, and G. Abstreiter, "Single-crystal Sn/Ge superlattices on Ge substrates: Growth and structural properties", Appl. Phys. Lett., vol. 57(9), pp. 875-877 (1990).

O. Gurdal, et al., "Growth of metastable $Ge_{1-x}Sn_x$/Ge stratined layer superlattices on Ge(001)2x1 by temperature-modulated molecular beam epitaxy", Appl. Phys. Lett., vol. 67(7), pp. 956-958 (1995).

P. R. Pukite, A. Harwit, and S. S. Iyer, "Molecular beam epitaxy of metastable, diamond structure $Sn_xGe_{1-x}$ alloys", Appl. Phys. Lett. 54(21), pp. 2142-2144 (1989).

M. Bauer, et al., "Ge-Sn semiconductors for band-gap and lattice engineering", Appl. Phys. Lett. 81(16), pp. 2992-2994 (2002).

L. Bellaiche, S.-H. Wei and Z. Zunger, "Localization and percolation in semiconductor alloys: GaAsN vs GaAsP", Phys. Rev. B 54, 17568-17576 (1996).

J. Taraci, J. Tolle, M. R. M. Cartney, J. Menendez, M. A. Santana, D. J. Smith, and J. Kouvetakis, "Simple chemical routes to diamond-cubic germanium-tin alloys", App. Phys. Lett. 78(23), pp. 3607-3609 (2001).

J. Taraci, S. Zollner, M. R. McCartney, J. Menéndez, M. A. Santana, D. J. Smith, A. Haaland, A. V. Tutukin, G. Gundersen, G. Wolf, and J. Kouvetakis, "Synthesis of silicon-based infrared semiconductors in the Ge-Sn system using molecular chemistry methods", J. of the Am. Chem. Soc., Col: 123(44), pp. 10980-10987 (2001).

V. Atluri, N. Herbots, D. Dagel, H. Jacobsson, M. Johnson, R. Carpio, and B. Fowler, "Comparison and reproducibility of H-passivation of Si(1000) with HF in methanol, ethanol, isopropanol and water by IBA, TMAFM, and FTIR", Mater. Res. Soc. Symp. Proc. 477, pp. 281-292 (1997) (Abstract).

Z. Charafi and N. Bouarissa, "The effect of the violation of Vegard's law on the optical bowing in $Si_{1-x}Ge_x$ alloys", Phys. Lett. A. vol. 234, pp. 493-497 (1997).

H. Kajiyama, S-I. Muramatsu, T. Shimada, and Y. Nishino, "Bond-length relaxation in crystalline $Si_{1-x}Ge_x$ alloys: An extended x-ray-absorption fine-structure study", Phys. Rev. B vol. 45(24), pp. 14005-14010 (1992).

F. Cerdeira, W. Dreyrodt, and M. Cardona, "Resonant raman scattering in germanium", Solid State Commun., vol. 10, 591-595 (1972).

M.M. McGibbon, N. D. Browning, M.F. Chisholm, A.J. McGibbon, S.J. Pennycook, V. Ravikumar, V.P. Dravid, "Direct determination of grain boundary atomic structure in $SrTio_3$" Science, vol. 266, pp. 102-104 (1994).

P. Mock, T. Topuria, N. D. Browning, G. R. Booker, N. J. Mason, R. J. Nicholas, M. Dobrowolska, S. Lee, and J. K. Furdyna, "Internal self-ordering in In(Sb,As), (In,Ga) Sb, and (Cd,Zn,Mn) Se nano-agglomerates/quantum dots", Appl. Phys. Lett., vol. 79(7), pp. 946-948. (2001).

D.M. Ceperley, B.J. Alder, "Ground State of the Electron Gas by Stochastic Method", Phys. Rev. Lett., vol. 45, pp. 566-569 (1980).

T G. Kresse and J. Hafner, "Ab initio molecular dynamics for liquid metals", Phys. Rev. B47(1), pp. R558-561 (1993).

G. Kresse and J. Hafner, "Ab ignition molecular-dynamics simulation of the liquid-metal-amorphous-semiconductor transition in germanium", Phys. Rev. B49(20), pp. 14251-14269 (1994).

G. Kresse, J. Furthmuller, "Efficiency of ab-initio total energy calculations for metals and semiconductors using a plane-wave basis set", Comput. Mater. Sci. vol. 6, pp. 15-50 (1996).

G. Kresse, J. Furthmuller, "Efficient iterative schemes for ab initio total-energy calculations using a plane-wave basis set", Phys. Rev. B54(16), pp. 11169-11186 (1996).

R. A. Soref and L. Friedman, "Direct-gap Ge/GeSn/Si and GeSn/Ge/Si heterostructures", Superlattices and Microstructures, vol. 14(2), 189-193 (1993).

M. R. Bauer, J. Kouvetakis, D.J. Smith and J. Menendez, "Tunable band structure in diamond cubic tin germanium alloys grown on Si", Solid State Commun., vol. 127, 355-359 (2003).

M.R. Bauer, P. Crozier, A.V.G Chizmeshya and J. D. Smith and J. Kouvetakis, "GeSn superstructured materials for Si-based optoelectronics", Appl. Phys. Lett. vol. 83, pp. 3489-3491 (2003).

M. Bauer et al., "Tunable band structure in diamond-cubic tin-germanium alloys grown on silicon substrates", Solid State Communications, vol. 127 (2003), pp. 355-359.

S. Cradock, E. A. V. Ebsorth, G. Davidson, L. A. Woodard, "Studies in Germyl Chemistry.3. Trigermylphosphine", J. Chem. Soc. A, 8, pp. 1229-1233 (1967).

D. W. H. Rankin, A. G. E. Robiet, G. M. Sheldrick, 5 Beagley, T. G. Hewit, "An electron Diffraction of the Molecular Structures of Trigermylphosphine and Trisilylstibine in the Gas Phase" J. Inorg. Nucl. Chem., 31, pp. 2351-2357 (1969).

E. A. V. Ebsworth, D. J. Hutchison, D. W. H. Rankin, "The Preparation, properties, and Gas-Phase Molecular-Structure of 1,1-Difluoro-2,2-Digermylbiphosphone",J. Chem. Res., Synop, 12, pp. 393, (1980).

E. A. V. Ebsworth, D. W. H. Rankin, G. M. Sheldrick, "Preparation and Properties of Trigermyl-arsine and—stibine", J. Chem. Soc. A, 11, pp. 2828-2830 (1968).

D. E. Wingeleth, A. D. Norman, "Redistribution of primary silyl-and germylphosphines; synthesis of trisilyl-and trigermylphosphines", Phosphorus Sulfur, 39(1-2), pp. 123-129, (1988).

G. A. Forsyth, D. W. H. Rankin, H. E. Robertson, "Determination of the molecular structure of Tris (Trimethylsilyl) phosphine in the gas phase by electron diffraction, supported by molecular mechanics calculations", J. Mol. Struct., vol. 239, pp. 209-217, (1990).

H. Schumann, H. J. Kroth, "NMR-Untersuchungen an Organoelementen(IVb)-Phosphinen, 2. Substituenteneinflusse auf die P-chemischen Verschiebungen von Trimethylelement (IVb)-phosphinen", Z. Naturforsch., B: Anorg. Chem., Chem. 32B, pp. 513-515, (1977).

G. Becker, H. Freudenblum, O. Mundt, M. Reti, M. Sachs, Synthetic Methods of Organometallic and Inorganic Chemistry, 3, pp. 193-198 (1996).

S. Schulz, M. Nieger, "Synthesis and characterization of organogallium-antimony compounds", J. of Organomet. Chem., vol. 570, pp. 275-278 (1998).

H. Schumann, U. Frank, W. W. Du Mont, F. Marschner, "Organometallarsine", J. Organomet. Chem, vol. 222, pp. 217-225 (1981).

M. Ates, H. J. Breunig, M. Denker, "Formation of $(Me_3M)_3Sb$ (M = Ge, Sn, Pb) and $(Me_3M)_4Sb_2$ (M = Pb) by reaction of $(Me_3Si)_3Sb$ with $Me_3MCl$", Phosphous, Sulfur Silicon Relate. Elem., vol. 102, pp. 287-289 (1995).

H. Schumann, A. Roth, O. Stelzer, M. Schmidt, "Pyramidenformige Molekule Mit Dem Atomskelett", Inorg. Nucl. Chem. Lett. 2, pp. 311-312, (1986).

G. Davidson, L. A. Woodward, E. A. V. Ebsworth, G. M. Sheldrick, "The vibrational spectra and structure of trisilylarsine and trisilylstibine", Spectrochim. Acta, Part A, vol. 23, pp. 2609-2616, (1967).

B. Beagley, A. G. Robiette, G. M. Sheldrick, "The Molecular Structures of (SiH3)3P and (SiH3)3As", Chem. Commun, 12, pp. 601-602 (1967).

A. Blake, E. A. V. Ebsworth, S. G. D. Henderson, "Structure of trisilylphosphine, $P(SiH_3)_{x1}$ at 100 K", Acta Crystallogr., Sect. C: Cryst. Struct. Commun, C47, pp. 486-489, (1991).

H. Siebert, J. Eints, "Neuvermessung des schwingungsspektrums von trisilylphosphin", J. Mol. Struct. vol. 4, pp. 23-28, (1969).

D. C. McKean, "On the spectroscopic evidence for geometry in $(SiH_3)_3P$ and $(SiH_3)_3As$", Spectrochim. Acta, Part A, vol. 24A, pp. 1253-1254 (1968).

J. E. Drake, J. Simpson, "Reactions of Monosilylarsine with Some Boron Lewis Acids and the Reaction of Monosilylphosphine with Boron Tribromide", J. Chem. Soc. A. 5, pp. 1039-1043 (1968).

E. H. Parker and T. E. Whall, "SiGe heterostructure CMOS circuits and applications", Solid State Electronics 43(8), pp. 1497-1506 (1999).

R. A. Soref and C. H. Perry, "Predicted band gap of the new semiconductor SiGeSn", J. Appl. Phys. 69, pp. 539-541 (1991).

K. A. Johnson and N. W. Ashcroft, "Electronic structure of ordered silicon alloys: Direct-gap systems", Phys. Rev. B 54, pp. 14480-14486 (1996).

A. R. Kost, in Infrared-Applications-of-Semiconductors-II. Symposium, (Mater. Res. Soc., 1998). pp. 3-10 (Abstract).

A. W. Bett, F. Dimroth, G. Stollwerck, and O. V. Sulima, "III-V compounds for solar cell applications", Appl. Phys. A: materials Science & Processing, vol. 69(2), pp. 119-129 (1999).

R. Gaska, A. Zukauskas, M. S. Shur, and M. A. Khan, "Progress in III-nitride based white light sources", Proceedings of the SPIE, vol. 4776, pp. 82-96 (2002).

R. Bauer, C. Ritter, P. Crozier, J. Menendez, J. Ren, and J. Kouvetakis, "Synthesis of ternary Si-Ge-Sn semiconductors on Si(100) via SnxGe1-x buffer layers", Appl. Phys. Lett. 83 (11), 2163-2165 (2003).

H.K. Shin, D.J. Lockwood, J.-M. Baribeau, "Strain in coherent-wave SiGe/Si superlattices", Solid State Commun., vol. 114(10), pp. 505-510 (2000).

M. Meléndez-Lira, J. D. Lorentzen, J. Menéndez, W. Windl, N. Cave, R. Liu, J. W. Christiansen, N. D. Theodore, and J. J. Candelaria, "Microscopic carbon distribution in $Si_{1-y}C_y$ alloys: A Raman scattering study", Phys. Rev. B 56, pp. 3648-3650 (1997).

C.S. Cook, S. Zollner, M.R. Bauer, P. Aella, J. Kouvetakis, and J. Menendez, "Optical constants and interband transitions of $Ge_{1-x}Sn_x$ alloys (x < 0.2) grown on Si by UHV-CVD", Thin Solid Films 455-456, pp. 217-221 (2004).

Chizmeshya, et al., "Experimental and Theoretical study of deviations from Vegards Law in the $Ge_{1-x} Ge_{1-x}$ system", Chem. Of Matls., vol. 15, pp. 2511-2519 (2003).

Aella, et al., "Structural and optical properties of $Sn_xSi_yGe_{1-x-y}$ alloys", App. Phys. Lett. vol. 84, pp. 888-890 (2004).

Roucka, et al., "Versatile buffer layer architectures based on $Ge_{1-x}Sn_x$ alloys", Appl. Phys. Let. vol. 86(19), pp. 191912-191914 (2005).

He, et al., "Synthesis of expitaxial $Sn_xGe_{1-x}$ alloy films by ion-assisted molecular beam epitaxy", App. Phys. Lett., vol. 68(5), pp. 664-666 (1996).

Pristovsek, et al., "Growth of strained gaAsSb layers on GaAs (001) by MOVPE", Journal of Crystal Growth, vol. 276, pp. 347-353 (2005).

Pristovsek, et al., "Growth of strained gaAsSb layers on GaAs (001) by MOVPE", Journal of Crystal Growth, vol. 276, pp. 347-353 (2005).

Wosinski, et al., "Deep levels caused by misfit dislocations in gaAsSb/GaAs heterostructures", Appl. Phys. Lett., vol. 67(8), pp. 1131-1133, (2001 ).

Dvorak, et al., "300 GHz InP/GaAsSb/InP double HBTs with high current capability and BVCEO < 6V", IEEE Electron Device Letters, vol. 22(8), pp. 361-363 (2001).

Ryu Sang-Wan, et al., "Optical characterization and determination of conduction band offset of type-II GaAsSb/InGaAs QW", Semiconductor Science and Technology, vol. 19, pp. 1369-1372 (2004).

Dowd, et al., "Long wavelength GaAsP/GaAs/GaAsSb VCSELs on GaAs substrates for communication applications", Electronics Letters, vol. 39(13), pp. 987-988 (2003).

Zheng, et al., "Demonstration of High-Speed staggered lineup GaAsSb-InP Unitraveling Carrier Photodiodes", IEEE Photonics Technology Letters, vol. 17(3), pp. 651-653 (2005).

Sun, et al., "GaAsSb: a novel material for near infrared photodetectors on GaAs substrates", Selected Topics in Quantum Electronics, IEEE Journal, vol. 8(4), pp. 817-822 (2002).

Kaniewski J., et al., "Resonant cavity enhanced InGaAs photodiodes for high speed detection of 1.55 μm infrared radiation", Proceedings of SPIE-The International Society for Optical Engineering (2005), vol. 5783 (Pt. 1, Infrared Technology and Applications XXXI), pp. 47-56.

Kang, Y., et al., "InGaAs-on-Si single photon avalanche photodetectors", Applied Physics Letters (2004), 85(10), pp. 1668-1670.

Kim S., et al., "High Performance 0.1μm GaAs Pseudomorphic High Electron Mobility Transistors with Si Pulse-Doped Cap Layer for 77GHz Car Radar Applications", Jpn. J. App. Phys. 44, pp. 2472-2475 (2005).

Cristea P., et al., "Growth of AlAsSb/InGaAs MBE-layers for all-optical switches", J. Cryst. Growth 278(1-4), pp. 544-547 (2005).

Li Y.J., et al., "Improved characteristics of metamorphic InAlAs/InGaAs high electron mobility transistor with symmetric graded $In_xGa_{1-x}As$ channel", J. of Vac. Sci. Tech. B 22(5), pp. 2429-2433 (2004).

Mao R. W., et al., "Fabrication of 1.55 μm Si-Based Resonant Cavity Enhanced Photodetectors Using Sol-Gel Bonding" IEEE Photonics Technology Letters 16(8), pp. 1930-1932 (2004).

Pauchard A., et al., "Wafer-bonded InGaAs/silicon avalanche photodiodes", Proceedings of SPIE-The International Society for Optical Engineering, vol. 4650 (Photodetector Materials and Devices VII), pp. 37-43 (2002).

Takano Y., et al., "Residual strain and threading dislocation density in InGaAs layers grown on Si substrates by metalorganic vapor-phase epitaxy", Appl. Phys. Lett., vol. 78(1), pp. 93-95 (2001).

Chriqui Y., et al., "Long wavelength room temperature laser operation of a strained InGaAs/GaAs quantum well structure monolithically grown by metalorganic chemical vapour deposition on a low energy-plasma enhanced chemical vapour deposition graded misoriented Ge/Si virtual substrate", Optical Materials, vol. 27, pp. 846-850 (2005).

V.K. Yang, et al., "Comparison of luminescent efficiency of InGaAs quantum well structures grown on Si, GaAs, Ge, and SiGe virtual substrate", J. Appl. Phys., vol. 93(9), pp. 5095-5102 (2003).

Shiu Fai Li, et al., Scaling law for the compositional dependence of Raman frequencies in GeSi and SnGe alloys, Appl. Phys. Lett., vol. 84, pp. 867-869 (2004).

Cook, et al., "Optical constants and interband transitions of Ge1-xSnx alloys (x<0.2) grown on Si", In press Thin Solid Films, vol. 455-456, pp. 217-221 (2004).

Menendez, et al., Type-I $Ge/Ge_{1-x-y} Si_xSn_y$ strained-layer heterostructures with a direct Ge band gap, Appl. Phys. Lett., vol. 85(7), pp. 1175-1177 (2004).

Park, et al., "Observation olarge stark shift in $Ge_xSi_{1-x}$/Si multiple quantum wells", J. Cac. Sci. Technol. B, vol. 8(2), pp. 217-220 (1990).

Baier, et la., "Type-II band alignment in Si/Si1_xGex quantum wells from photoluminescence line shifts due to optically induced band-bending effects: Experiment and theory", Phys. Rev. B, vol. 50(20), pp. 15191-15196 (1994).

Temkin, et al., "GexSi1-x strained-layer superlattice waveguide photodetectors operating near 1.3_m", Appl. Phys. Lett., vol. 48(15), pp. 963-965 (1986).

Li, et al., (2000), "Observation of quantum-confined stark shifts in SiGe/Si type-I multiple quantum wells", J. Appl. Phys. vol. 87(11), pp. 8195-8197.

Miyake, et al., "Absence of stark shift in strained Si1-xGex/Si type-I quantum wells", Appl. Phys. Lett., vol. 68(15), pp. 2097-2099 (1996).

O. Qasaimeh, et al., (1997), "Electroabsorption and Electrooptic Effectin SiGe-Si Quantum Wells: Realization of Low-Voltage Optical Modulators", IIEEE J. Quantum Electron, vol. 33 (99), pp. 1532-1536.

Jaros, "Simple analytic model for heterojunction band offsets", Phys. Rev. B. vol. 37(12), pp. 7112-7114 (1988).

Tolle, et al., "Epitaxial growth of group III nitrides on Si substrates via a reflective lattice-matched zirconium diboride buffer layer", Appl. Phys. Lett., vol. 82(15), pp. 2398-2400 (2003).

Hu, et al., "Nucleation and growth of epitaxial $ZrB_2(0001)$ on Si(111)", Journal of Crystal Growth, vol. 267, (2004) pp. 554-563.

Tolle, et al., "Epitaxial growth of AlGaN by metalorganic chemical vapor deposition on Si(111) via a $ZrB_2(0001)$ buffer layer", Appl. Phys. Lett, vol. 84(18), pp. 3510-3512 (2004).

R.F.C. Farrow et al., "The growth of metastable, heteroepitaxial films of $a$-Sn by metal beam epitaxy", J. Cryst. Growth, vol. 54, pp. 507-518 (1981).

G Becker et al., "Notiz uber eine einfache methode zur darstellung von tris (trimethylsilyl)phosphin", Chem. Ber., vol. 108, pp. 2484-2485 (1975).

H. Schumann et al., "Trimethylsilyldiphosphane", J. Organomet. Chem., vol. 88, pp. C13-C16, (1975).

H. Schumann et al., "Eine einfache Methode zur Synthese von Organosilylphosphinen", J. Organometalic Chem. vol. 55, pp. 257-260 (1973).

H. Burger et al., "Schwingungsspektren und Kraftkonstanten von Silyl-und Trimethylsilyl-Verbindungen von Elementen der 5. Gruppe", Spectrochimica. Acta, vol. 26A, pp. 671-683, (1970).

H.J. Breunig et al., "Crystal structures of tris (trimethylsilyl) stibine and pentacarbonyl(tris(trimethylsilyl) stibine) chromium", Journal of Organometallic Chemistry, vol. 608 (2000), pp. 60-62.

L. Rosch et al., "Darstellung und untersuchung von phosphinkomplexen mit aluminiumtrichlorid und aluminiumtriathyl", Anorg. Allg. Chem, vol. 426, pp. 99-106 (1976).

H. Schumann et al., "Substituentenaustauschreaktionene zwischen Tris (Trimethylsilyl) phosphan und Trimethylgermanium- und Trimethylzinnchlorid", Z. Naturforsch., vol. 29B, 608-610 (1974).

H. Schumann et al., "Darstellung und Schwingungsspektren von Trimethylsilyl-, Trimethylgermyl-und Trimethyl-stannyl-tert-butylphosphinen", Chem. Ber., vol. 107, pp. 854-869 (1974).

A.V.G. Engelhardt et al. Naturforsch., "Über die IR-, Raman-und $^{31}$P-NMR-Spektren ciniger phosphinderivate von germanium und zinn", B: Anorg. Chem., Org. Chem., Biochem, Biophys., Biol. vol. 22b, pp. 352-353 (1967).

J.W. Anderson, J.E. Drake, "Trimethylstannylarsines", Canadian Journal of Chemistry, vol. 49, pp. 2524-2528 (1971).

E. Niecke, H. Westermann, "A simple method for the preparation of Tris (trimethylsilyl) phosphine", Synthesis, (1988), p. 330.

H.J. Breunig et al., Naturforsch., "Tetrakis (Trimethylsilyl) distiban", Z. Naturforsch., vol. 34B, pp. 926-928 (1979).

H.J. Breunig, "Synthese von Tetrakis (trimethylgermyl)-Distaiban", Z. Naturforsch., vol. 33B, pp. 244-245, (1978).

Spanier, et al., "The Synthesis of Germylsilane from Silane and German in a Silent Electric Discharge", Inorganic Chemistry, (1962), pp. 215-216.

Kouvetakis, et al., U.S. Appl. No. 10/559,980, filed on Dec. 8, 2005.

Kouvetakis, et al., U.S. Appl. No. 10/559,981, filed on Sep. 5, 2006 (Projected Publication date is Jan. 11, 2007).

* cited by examiner

$Si_xSn_yGe_{1-x-y}$ AND RELATED ALLOY HETEROSTRUCTURES BASED ON SI, GE AND SN

RELATED APPLICATION DATA

This application is based on and claims the benefit of U.S. Provisional Patent Application No. 60/478,480 filed on Jun. 13, 2003, the disclosure of which is incorporated herein by this reference.

STATEMENT OF GOVERNMENT FUNDING

The United States Government provided financial assistance for this project through the National Science Foundation under Grant No. DMR 0221993, through the Army Research Office under Grant No. DAA 19-00-1-0471 and through Air Force Research Laboratory/SNHC under Grant No. F19628-03-C-0056. Therefore, the United States Government may own certain rights to this invention.

BACKGROUND

This invention relates generally to semiconductor materials and, more particularly, to direct-gap semiconductors and related alloy heterostructures based on Si, Ge and Sn.

It has been known for many years—on theoretical grounds—that the Sn—Ge alloy system and the Si—Ge—Sn ternary alloy should have very interesting properties, especially as infrared devices. This has stimulated intense experimental efforts to grow such compounds, but for many years the resulting material quality has been incompatible with device applications.

The physical properties of most semiconductor alloys are smooth functions of their composition, providing a very versatile tool for device engineering. Alloys of elemental semiconductors such as Si and Ge, and alloys of III-V compounds such GaAs, AlAs, InAs, and InP, play a key role in high-speed microelectronics (see, e.g., E. H. Parker and T. E. Whall, Solid State Electronics 43, 1497 (1999)) and in optoelectronics (see, e.g., M. Quillec, in *Critical Issues in Semiconductor Materials and Processing Technologies* (Kluwer Academic Publishers, Dordrecht, Netherlands, NATO Advanced Study Institute on Semiconductor Materials and Processing Technologies, 1992)). In particular, the group-IV $Ge_xSi_{1-x}$ system is a nearly ideal semiconductor alloy, with a lattice constant and interband optical transition energies that are essentially linear functions of x. See O. Madelung, *Semiconductors—basic data* (Springer, Berlin, N.Y., 1996).

An even more intriguing group-IV alloy is the $Ge_{1-x}Sn_x$ system. Group-IV semiconductors are notorious for not displaying a direct band gap, which precludes their use as active layers in light-emitting diodes and lasers. The band gap of the $Ge_{1-x}Sn_x$ alloy, however, is expected to undergo an indirect-to-direct transition, since the direct band gap has a value of 0.81 eV in Ge and becomes negative (−0.4 eV) in gray (α-) Sn. See M. L. Cohen and J. R. Chelikowsky, *Electronic Structure and Optical Properties of Semiconductors* (Springer, Heidelberg, Berlin, N.Y., 1989).

We previously have achieved successful formation of $Ge_{1-x}Sn_x$ films, which has prompted us to undertake exploratory research aimed at synthesis of the experimentally unknown Si—Ge—Sn ternary analog. This ternary system offers the potential of band gap and strain engineering and tuning of the optical properties of the system, as indicated by theoretical studies conducted by Soref and Perry as well Johnson and Ashcroft. (R. A. Soref and C. H. Perry, J. Appl. Phys. 69, 539 (1991); K. A. Johnson and N. W. Ashcroft, Phys. Rev. B 54, 14480 (1996).

It is an object of the present invention, therefore, to provide device-quality $Si_xSn_yGe_{1-x-y}$ semiconductor materials and a procedure for synthesizing such materials.

Additional objects and advantages of the invention will be set forth in the description that follows, and in part will be apparent from the description, or may be learned by practice of the invention. The objects and advantages of the invention may be realized and obtained by the instrumentalities and combinations pointed out herein.

SUMMARY OF THE INVENTION

According to the present invention, there is provided a novel method for synthesizing device-quality alloys and ordered phases in a Si—Ge—Sn system using a UHV-CVD process. The method is based on precursor CVD in which growth mechanisms and surface kinetics are substantially different than those inherent to MBE processes to generate new materials that cannot be created by conventional CVD and MBE routes.

In accordance with the invention, we have grown device-quality Sn—Ge—Si materials directly on Si substrates. Single-phase $Si_xSn_yGe_{1-x-y}$ semiconductors ($x \leq 0.25$, $y \leq 0.11$) were grown for the first time on Si via $Ge_{1-x}Sn_x$ buffer layers utilizing reactions of $SnD_4$ with $SiH_3GeH_3$. The $Ge_{1-x}Sn_x$ buffer layers facilitate heteroepitaxial growth of the $Si_xSn_yGe_{1-x-y}$ films and act as compliant templates that can conform structurally and absorb the differential strain imposed by the more rigid Si and Si—Ge—Sn materials. The $SiH_3GeH_3$ species was prepared using a new and high yield method that provided high purity semiconductor grade material.

The crystal structure, elemental distribution and morphological properties of the $Si_{1-x-y}Ge_xSn_y/Ge_{1-x}Sn_x$ heterostructures are characterized by high-resolution electron microscopy, including electron energy loss nanospectroscopy, x-ray diffraction and atomic force microscopy. These techniques demonstrate growth of perfectly epitaxial, uniform and highly aligned layers with atomically smooth surfaces and monocrystalline structures that have lattice constants above and below that of Ge. On-and-off axis reciprocal space maps of the (004) and (224) reflections were used to determine the strain properties of the layers. The data indicated that the $Ge_{1-x}Sn_x$ buffer layers are completely relaxed with respect to Si (100) while the $Si_{1-x-y}Ge_xSn_y$ films can be either fully strained or relaxed. The strain of $Si_{1-x-y}Ge_xSn_y$ can be tuned by adjusting the Sn content of the buffer layer or Si/Sn ratio of the epilayer. Rutherford backscattering ion channeling shows that the constituent elements occupy random substitutional sites in the same average diamond cubic lattice and the Raman shifts are consistent with the lattice expansion produced by the Sn incorporation into SiGe tetrahedral sites. First principles simulations predict that these materials are thermodynamically accessible and yield lattice constants as a function of Si/Sn concentrations in good agreement with experiment. An empirical model derived from experimental $Si_xGe_{1-x}$ and $Sn_yGe_{1-y}$ binary data also provides a quantitative description of the composition dependence of the lattice parameters. Spectroscopic ellipsometry of selected samples yields dielectric functions indicating a band structure consistent with highly crystalline semiconductor materials of diamond symmetry. Incorporation of Si into $Sn_yGe_{1-y}$ leads to an additional reduction of the $E_2$ critical point, as expected based on the $E_2$ values of Si and Ge.

BRIEF DESCRIPTION OF THE DRAWINGS

The accompanying drawings, which are incorporated in and constitute a part of the specification, illustrate the presently preferred methods and embodiments of the invention. Together with the general description given above and the detailed description of the preferred methods and embodiments given below, they serve to explain the principles of the invention.

DESCRIPTION

Figure 1:
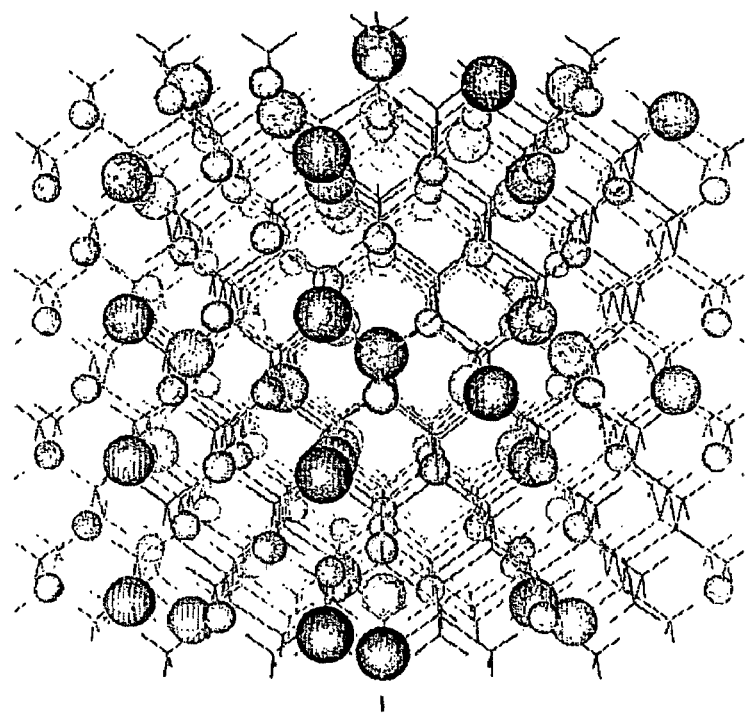
FIG. 1 shows the structure of the highly saturated $Si_{13}Sn_5Ge_{46}$ alloy (20.3% Si, 7.8% Sn, 71.9% Ge) according to the present invention, obtained from first-principles optimization of all cell dimensions and atomic positions.

Previously, we have achieved the successful formation of $Ge_{1-x}Sn_x$ films via UHV-CVD reactions of the gaseous $SnD_4$ and $G_2H_6$ on Si substrates. The details of this work are described fully by M. Bauer, J. Taraci, J. Tolle A. V. G Chizmeshya, S. Zollner, J. Menendez, D. J. Smith and J. Kouvetakis, *Appl. Phys. Lett* 81, 2992 (2002); M. R. Bauer, J. Kouvetakis, D. J. Smith and J. Menendez, *Solid State Commun.* 127, 355 (2003); M. R. Bauer, P. Crozier, A. V. G Chizmeshya and J. D. Smith and J. Kouvetakis *Appl. Phys. Lett.* 83, 3489 (2003), which are incorporated herein in their entirety by this reference. According to the present invention, we have developed a method for preparation of $Si_xSn_yGe_{1-x-y}$ alloys via UHV-CVD reactions of the gaseous compound $SiH_3GeH_3$ with $SnD_4$.

Since no experimental data was available, computed the properties of SnGeSi alloys using a linear interpolation scheme. Following this approach—combined with deformation potential theory—we have theoretically computed the properties of strained Ge layers grown on relaxed $Si_{1-x-y}Ge_x Sn_y$ layers, and we found that for appropriately selected Si/Sn ratios the heterostructure is a direct gap Type I system with both electrons and holes confined in the pure Ge layers. This remarkable finding highlights the importance of growing Si—Ge—Sn alloys. The ternary $Sn_xSi_yGe_{1-x}$ alloys make it possible, for the first time, to decouple band gap and strain, in much the same way as done with quaternary III-V alloys.

Decoupling bandgap and strain in group III-V quarternary semiconductors has led to widespread applications of these materials. See G. A. Antypas, in *GaInAsP Alloy Semiconductors*, edited by T. P. Pearsall (Wiley, Chichester, 1982), p. 3.; A. R. Kost, in *Infrared-Applications-of-Semiconductors-II* (Mater. Res. Soc., 1998), p. 3.; A. W. Bett, F. Dimroth, G. Stollwerck, and O. V. Sulima, Appl. Phys. A A69, 119 (1999). R. Gaska, A. Zukauskas, M. S. Shur, and M. A. Khan, Proceedings of the SPIE 4776, 82 (2002). For Si-based materials, therefore, the Si—Sn—Ge ternary system should have a similar impact in the group IV arena.

Method for Preparing $Si_xSn_yGe_{1-x-y}$ Alloys

Our synthetic strategy for preparation of $Si_xSn_yGe_{1-x-y}$ alloys is focused on UHV-CVD reactions of the gaseous compound $SiH_3GeH_3$ with $SnD_4$. The former is a simple derivative of digermane, $GeH_3GeH_3$, in which one of the $GeH_3$ groups is replaced with $SiH_3$ thus forming a molecular core with direct Si—Ge bonds. $H_3SiGeH_3$ is a stable, gaseous molecule with a boiling point of about 7° C., and it is synthesized via a novel and high yield method outlined below:

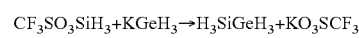

$$CF_3SO_3SiH_3 + KGeH_3 \rightarrow H_3SiGeH_3 + KO_3SCF_3$$

In addition to the high yield, which makes the $H_3SiGeH_3$ commercially attractive for semiconductor applications, this new method also provides the required high quality material suitable for device development and processing. R. Bauer, C. Ritter, P. Crozier, J. Menendez, J. Ren, and J. Kouvetakis *Appl. Phys. Lett.* 83 (9), 2163 (2003).

Prior to growing Si—Ge—Sn we performed controlled experiments involving the thermal dehydrogenation of $H_3SiGeH_3$ to study the deposition characteristics of this compound on Si(100) and thereby determine optimum conditions for growth of the target Si—Ge—Sn concentrations. We found that complete decomposition of $H_3SiGeH_3$ occurs readily at 450-700° C. to yield coherent SiGe quantum dots. Only partial decomposition takes place between 450° C. and 375° C. to form amorphous hydrogenated films and no significant decomposition was obtained at 350° C. indicating that this temperature might be a reasonable starting point to initiate reactions of $SiH_3GeH_3$ and $SnD_4$ and produce Si—Ge—Sn films. Our previous studies have also indicated that 350° C.-250° C. is an optimum temperature range for incorporation of Sn into tetrahedral Ge lattice sites without any phase segregation and Sn precipitation.

Synthesis of $H_3SiGeH_3$

An important aspect of the successful synthesis of $S_{1-x-y}Ge_xSn_y$ alloys via our CVD process is the use of the custom prepared $H_3SiGeH_3$ as the source of Si and Ge atoms. The original synthesis of $H_3Si$—$GeH_3$ was reported by McDiarmad et al. in 1964. These authors used electric discharges of silane and germane to obtain small quantities (5% yield) of the product. The primary goal was to establish the identity of the compound and study key physical and spectroscopic properties. We have discovered a new and practical method to prepare the compound in practical yields so that it can be utilized in semiconductor research and development. Our method employs inexpensive reagents and conventional laboratory procedures that are much easier to those described in the previous synthesis. Our method has afforded excellent purity material which was used to produce SiGe nanostructures on Si(100) via the GSMBE method and novel Si—Ge—Sn alloys via UHV-CVD. The compound can be adapted easily to existing CVD technologies, is an excellent alternative to $GeH_4$ and provides additional benefits such as low processing temperatures, stoichiomtery control of the film, and homogeneous compositional distributions of the Si and Ge elements. This material can also be used to grow stoichiometric SiGe via a unimolecular dehydrogenation as well as alloys with concentrations x<0.50 via CVD reaction of $SiH_4$ or $Si_2H_6$.

The high reactivity of $H_3SiGeH_3$ makes it uniquely suitable for the low temperature preparation of the desired metastable product. The reactions of the compound with $SnD_4$ proceed readily at a well define set of growth conditions via a facile and complete elimination of the H atoms to produce single-phase material incorporating substitutional Sn atoms. Preparations based on reactions of commercially available stock sources such as $H_3SiSiH_3$ and $H_3GeGeH_3$ yielded invariably polycrystalline multiphase films despite numerous attempts to work out suitable growth conditions for formation of pure material.

The synthesis of $H_3SiGeH_3$ according to our method is conducted via a metathesis reaction between equal concentrations of $KGeH_3$ and $H_3SiOSO_2CF_3$ at −60° C. The synthetic procedure is summarized by the equation below:

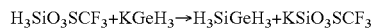

$$H_3SiO_3SCF_3 + KGeH_3 \rightarrow H_3SiGeH_3 + KSiO_3SCF_3$$

The low reaction temperature affords the product at 35-40% yield, which is much higher than the 20% yield reported previously. Another major advantage of our new method is the use of inexpensive and readily accessible reagents such as the $H_3SiOSO_2CF_3$ starting material. This species is prepared in our laboratories almost quantitatively by a single step direct reaction of standard laboratory chemicals $C_6H_5SiH_3$ and $HOSO_2CF_3$ A possible limitation is the slow decomposition of $H_3SiOSO_2CF_3$ which tends to liberate silane over time at room temperature. Accordingly the compound should be used within as prepared or it must be stored at −25° C. for the long term in order to avoid decomposition.

A 45 mL solution of 4.00 g $KGeH_3$ (3.49 mmol) in diglyme was added dropwise over the course of 45 minutes to a 35 mL toluene solution of 9.43 g $H_3SiOSO_2CF_3$ (5.24 mmol) in a 250 mL, 3-neck round bottom flask with magnetic stir bar at −60° C. The reaction flask was connected to a series of 3 U-traps, which were used to distill and purify the product. During the reaction several drops of the $KGeH_3$/diglyme solution were added at one time to the flask under vigorous stirring and then the addition funnel was closed. A short time (10-15 seconds) later, the flask was opened to the traps and the volatiles (including the product which was generated almost immediately) were passed through a −78° trap to two traps held at −196° C. This procedure was repeated until all of the $KGeH_3$ was consumed. After the addition was completed, the reaction flask was slowly warmed to room temperature under dynamic pumping through the cold traps to remove any remaining product. Pumping through the traps continued for an additional hour at room temperature after which the t contents of the traps were examined by gas-phase IR spectroscopy. The −78° C. trap was found to contain a mixture of benzene, diglyme and toluene while the −196° traps contained $SiH_3GeH_3$, $SiH_4$ and $GeH_4$. The $SiH_3GeH_3$, $SiH_4$, $GeH_4$ mixture was fractionally redistilled through traps held at −130° ($H_3SiGeH_3$) and a −196° ($SiH_4$, and $GeH_4$). The product was further purified to remove any residual $GeH_4$ and gave a final yield of 35-40% yield.

Si—Ge—Sn Alloys

The following examples help to further explain how we grew Si—Ge—Sn alloys using the method described above and demonstrate high quality of the resulting films. It will be understood, however, that the examples are illustrative of the process and materials of the invention that the invention is not limited only to these examples.

We initially investigated the growth of $Si_{1-x-y}Ge_xSn_y$ directly on Si (100) using $Ge_{1-x}Sn_x$ (x=2-4 at. %) buffer layers. We chose $Ge_{1-x}Sn_x$ alloys as buffer layers because they possess crystallographic, morphological and mechanical properties that make them uniquely suitable for use as templates on Si substrates. These materials grow as highly uniform, strain-free layers with smooth and continuous surface morphologies (typical AFM rms values are 0.5 and 1.4 nm) and display extremely low concentrations of threading defects, particularly those that extend to the uppermost surface (the quality of pure Ge films grown on Si by similar methods is much worse). In addition, they are high compressibility (softer) solids compared to either Si and $Si_{1-x-y}Ge_xSn_y$ and thereby can act as potential spacers that can conform structurally and readily absorb the differential strain imposed by the more rigid Si and Si—Ge—Sn.

The $Ge_{1-x}Sn_x$ buffer layers were grown on Si(100) via reactions of $Ge_2H_6$ and $SnD_4$ at 350° C. The growth of the $Si_{1-x}Ge_xSn_y$ films was conducted immediately thereafter, in situ, via reactions of appropriate concentrations of $SnD_4$ and $H_3SiGeH_3$ between 310-370° C. The reactions produced a wide range of alloys including those with compositions $Si_{0.18}Sn_{0.10}Ge_{0.72}$, $Si_{0.20}Sn_{0.08}Ge_{0.72}$, $Si_{0.18}Sn_{0.065}Ge_{0.755}$, $Si_{0.13}Sn_{0.06}Ge_{0.81}$, $Si_{0.13}Sn_{0.03}Ge_{0.84}$ and $Si_{0.20}Sn_{0.02}Ge_{0.78}$. This set of compositions was derived from the well-known $Sn_xGe_{1-x}$ (x=2-10%) alloys by substituting Ge in the Sn—Ge lattice by Si, and they are particularly attractive since they are readily amenable to first principles simulations using a standard 64-atom supercell representation $Si_{12}Sn_6Ge_{46}$, $Si_{13}Sn_5Ge_{46}$, $Si_{12}Sn_4Ge_{48}$, $Si_8Sn_4Ge_{52}$, $Si_8Sn_2Ge_{54}$ and $Si_{13}Sn_1Ge_{50}$. Table 1 shows the close correspondence between the model concentrations and those of the synthesized alloys. FIG. 1 shows a structural model of the high Sn content alloy $Si_{13}Sn_5Ge_{46}$ (20.3% Si, 7.8% Sn, 71.9% Ge) obtained from first-principles optimization of all cell dimensions and atomic positions. The view is along the (110) direction. Large and small spheres are Si and Sn, respectively, while the Ge lattice structure is shown using gray lines (atoms not shown for clarity). Note the in spite of the high density of Si/Sn constituents the free energy of formation is only slightly metastable (10.4 meV) for the random structure shown.

TABLE 1

Comparison of "best estimates" based on ab initio calculations (see text for explanation) and experimental lattice constants for selected samples. Top panel: Energy, Free energy and lattice constants obtained from first principles LDA calculations. Bottom panel: Comparison of Vegard's law (VEG) and empirical formula results (LC) with experiment. Values in parentheses indicate % deviation from experimental Ge lattice constant (5.658 Å).

| % Si | % Ge | % Sn | ΔE (meV) | ΔG$^{300}$ (mev) | a*$_{LDA}$ (Å) |
|---|---|---|---|---|---|
| 18.8 | 71.9 | 9.4 | 31.0 | 11.6 | 5.689 (+0.5) |
| 20.3 | 71.9 | 7.8 | 29.4 | 10.4 | 5.672 (+0.3) |
| 18.8 | 75.0 | 6.3 | 23.9 | 6.3 | 5.663 (+0.1) |
| 12.5 | 81.3 | 6.3 | 21.4 | 6.4 | 5.678 (+0.4) |
| 12.5 | 84.4 | 3.1 | 14.7 | 1.9 | 5.652 (−0.1) |
| 20.3 | 78.1 | 1.6 | 13.9 | −0.6 | 5.619 (−0.7) |

| % Si | % Ge | % Sn | a$_{VEG}$ (Å) | a$_{LC}$ (Å) | a$_{EXP}$ (A) |
|---|---|---|---|---|---|
| 18 | 72 | 10 | 5.700 (+0.7) | 5.712 (+0.9) | 5.684 (+0.5) |
| 20 | 72 | 8 | 5.679 (+0.4) | 5.687 (+0.5) | 5.668 (+0.2) |
| 18 | 75.5 | 6.5 | 5.671 (+0.2) | 5.678 (+0.3) | 5.680 (+0.4) |
| 14 | 80 | 6 | 5.676 (+0.3) | 5.683 (+0.4) | 5.690 (+0.6) |
| 13 | 84 | 3 | 5.654 (−0.1) | 5.656 (0.0) | 5.644 (−0.3) |
| 20 | 78 | 2 | 5.629 (−0.5) | 5.629 (−0.5) | 5.630 (−0.5) |

The substrates were prepared using a modified RCA process followed by hydrogen surface passivation and the growth was conducted in the presence of large concentrations of research grade $H_2$ at $10^{-2}$ Torr (typical base pressure was $1\times10^{-9}$ Torr). The samples were then grown by systematically adjusting the temperature, pressure and reactant concentrations. In all cases device quality materials with single-phase concentrations and random diamond cubic structures were obtained. Rutherford backscattering (RBS) in random mode was used to determine the bulk composition of the $Ge_{1-x}Sn_x$/$Si_{1-x-y}Ge_xSn_y$ heterostructures and to estimate the film thickness. The RBS analysis revealed a two-layer heterostructure with thickness of 70-100 nm for the $Si_{1-x-y}Ge_xSn_y$ films and 50-100 nm for the $Sn_xGe_{1-x}$ buffer layers. The range of atomic concentrations were found to be 13-20% Si, 62-85% Ge, and 1-11% Sn (see Table 1 for selected samples). The maximum Sn content samples (11%-7% Sn) were deposited reproducibly between 310 and 340° C., respectively while at higher temperatures (350-375° C.) the deposition yielded lower Sn concentrations of 6 at. %-1 at. %.

Figure 2:
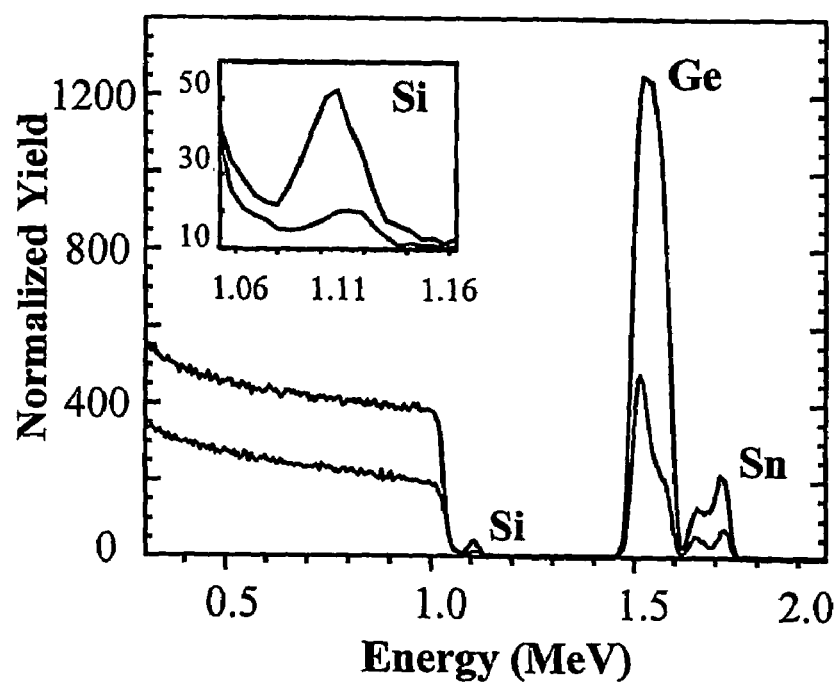
FIG. 2 shows RBS random and channeled (lower trace) spectra of a $Si_{0.14}Ge_{0.08}Sn_{0.06}$ epilayer and a $Ge_{0.96}Sn_{0.04}$ buffer layer according to the invention, showing a highly aligned and epitaxial alloy heterostructure. The inset shows an enlarged view of the Si peak which channels remarkably well indicating complete substitutionality of the Si atoms in Si—Ge—Sn lattice.

FIG. 2 shows RBS random and channeled (lower trace) spectra of a $Si_{0.14}Ge_{0.80}Sn_{0.06}$ epilayer and a $Ge_{0.96}Sn_{0.04}$ buffer layer on Si, according to the invention, showing a highly aligned and epitaxial alloy heterostructure. The inset shows an enlarged view of the Si peak which channels remarkably well indicating complete substitutionality of the Si atoms in Si—Ge—Sn lattice. Note that the Sn signal of the entire layer consists of two peaks, a narrow high-energy peak corresponding to the epilayer and the adjoining low energy Sn peak of the buffer layer. The Sn concentrations in each layer,
as determined from the peak height are 6 and 4 at. %, respectively. The epilayer and buffer layer thickness as determined from the peak width are 45 and 115 nm, respectively. The small peak located next to the Si substrate signal is due to the Si in the epilayer. The Si peak is well separated from the substrate signal (does not appear as a shoulder, or step adjacent to the substrate) indicating the absence of Si in the buffer layer.

Figure 3:
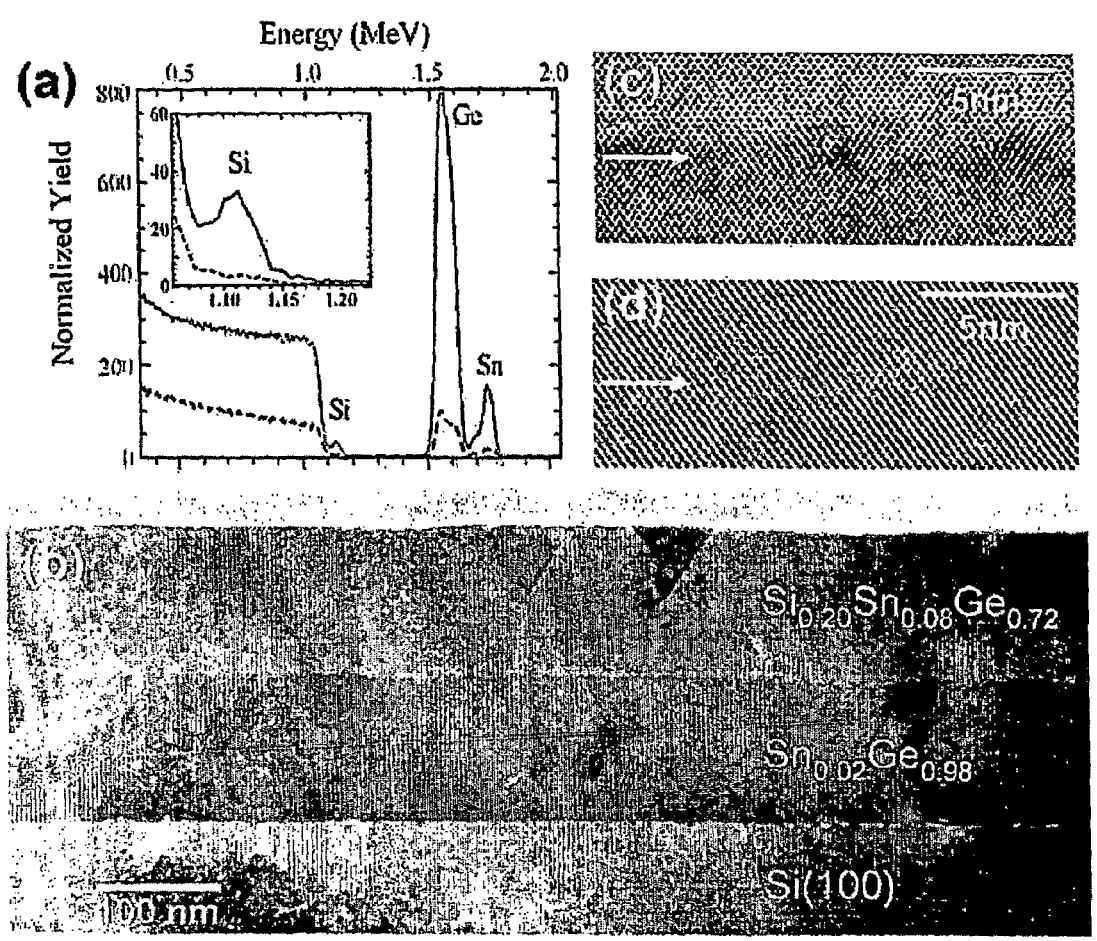
FIG. 3 shows: (a) RBS aligned (dotted line) and random (solid line) spectra of $Si_{0.20}Sn_{0.08}Ge_{0.72}$ epilayer and $Sn_{0.02}Ge_{0.98}$ buffer layer showing a highly aligned heterostructure, with the inset being a magnified view of the Si peak indicating complete substitutionality of Si in the Sn—Ge lattice: (b) XTEM of the entire heterostructure showing uniform layer thickness and smooth surface topologies; (c) $Si/Sn_{0.02}Ge_{0.98}$ interface; and (d) $Si_{0.20}Sn_{0.08}Ge_{0.72}/Sn_{0.02}Ge_{0.98}$ interface (indicated by arrows) showing perfect alignment of (111) lattice planes.

FIG. 3 (panel a) compares random and aligned RBS spectra for a $Si_{0.20}Sn_{0.08}Ge_{0.72}$ alloy grown on a $Sn_{0.02}Ge_{0.98}$ buffer layer. The high degree of He ion channeling found for Si, Ge and Sn confirms full substitutionality of the elements in the structure, and indicates the formation of epitaxial materials. This was also confirmed by high resolution cross sectional electron microscopy (XTEM), atomic force microscopy (AFM), and x-ray diffraction (rocking curves) which revealed highly aligned layers with mono-crystalline structures and atomically smooth surfaces. This is demonstrated in FIG. 3 (panel b), which shows a dark field image of the entire $Si_{0.20}Sn_{0.08}Ge_{0.72}$/$Sn_{0.02}Ge_{0.98}$/Si heterostructure. In general we find that the crystallinity is superior for samples in which the buffer layer was annealed in situ for a short time period. The annealing step resulted in an overall reduction of threading defects, particularly those terminating at the top surface. This provides a highly ordered and defect free interface for subsequent growth of SiSnGe. Remarkably for all samples, the root mean square surface roughness, as measured by AFM, is 0.5 to 1.0 nm. Referring to FIG. 3 (panel d), a high-resolution micrograph of the $Si_{0.20}Sn_{0.08}Ge_{0.72}$/$Sn_{0.02}Ge_{0.96}$ interface clearly shows a commensurate and virtually defect-free microstructure. Micrographs of the buffer layers show that the lattice mismatch between the two materials is accommodated by periodic edge dislocations located at the interface, as shown in FIG. 3 (panel c). These are parallel to the interface plane rather than parallel to the growth direction as in threading dislocations, which are known to degrade the crystallinity and the electrical properties of the film.

The elemental uniformity across the entire layer was investigated with Auger electron spectroscopy (AES), energy dispersive x-ray (EDX) and electron energy loss (EELS) spectroscopies with nanometer sized electron probes. The AES data revealed highly homogeneous elemental profiles throughout each layer of the heterostructure and showed sharp changes of composition across each interface. The EDX, and EELS nanospectroscopies showed a homogeneous distribution of Ge and Sn throughout the buffer layer, which is consistent with single-phase material. Analysis across the epilayer revealed significant concentrations of Si, and Sn and a large concentration of Ge. The constituent elements appeared together at every nanometer scale region probed without any indication of phase segregation or Sn precipitation.

Figure 4:
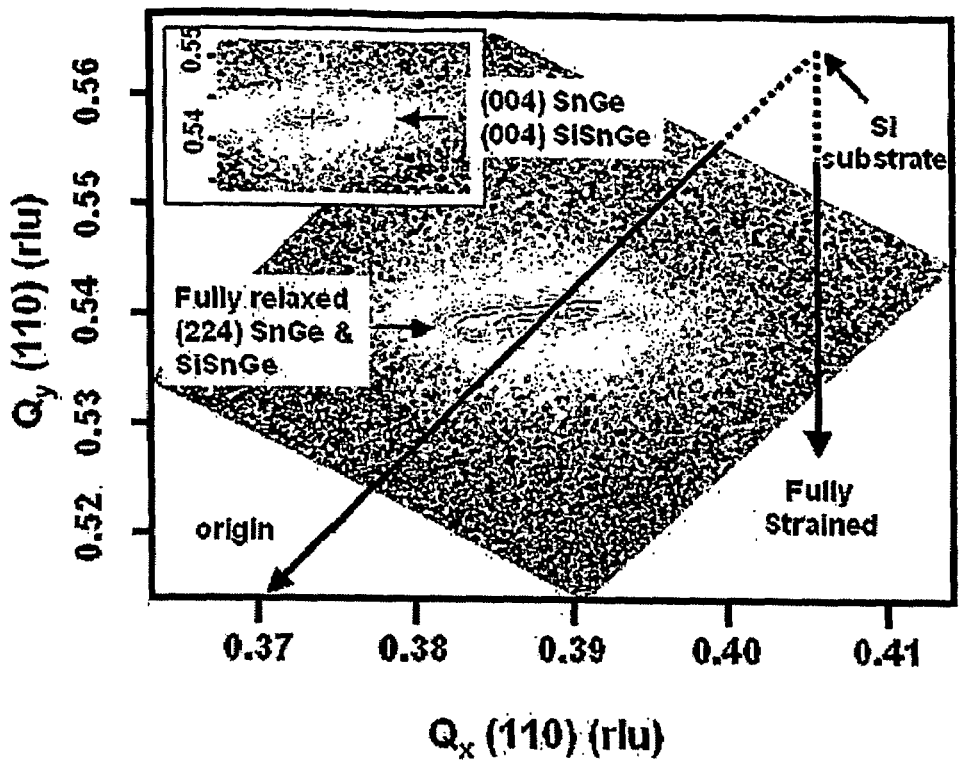
FIG. 4 shows reciprocal space maps for the (224) reflections of the $Sn_{0.02}Ge_{0.98}$ buffer layer and $Si_{0.20}Ge_{0.72}Sn_{0.08}$ epilayer. The (004) peaks are shown in the inset. The data show a single peak for both (004) and (224) reflections, indicating that the layers are completely lattice matched (the vertical and in-plane lattice parameters of the layers are identical). The data also indicate that the films are relaxed with respect to the Si substrate. For full relaxation, the epilayer peak lies on the line connecting the Si peak to the origin. This line passes through the center of the GeSn peak, consistent with fully relaxed GeSn grown on Si.
Figure 5:
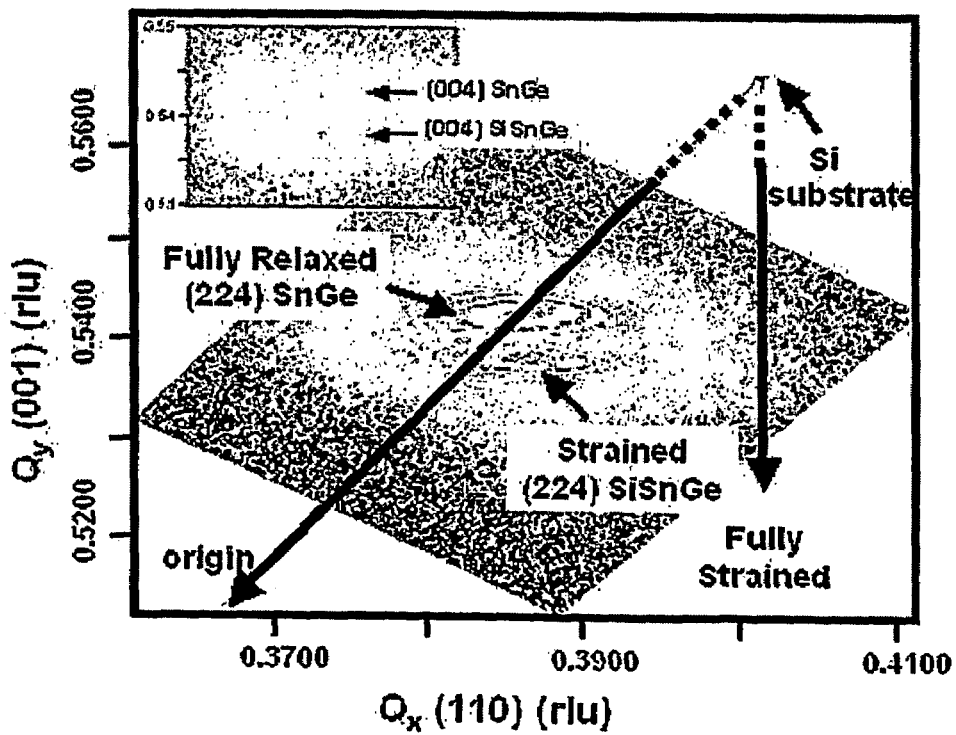
FIG. 5 shows reciprocal space maps for the (224) and (004) Bragg reflections of $Sn_{0.02}Ge_{0.98}$ buffer and $Si_{0.20}Ge_{0.70}Sn_{0.10}$ epilayer, indicating that the film is completely strained with respect to the buffer.
Figure 6:
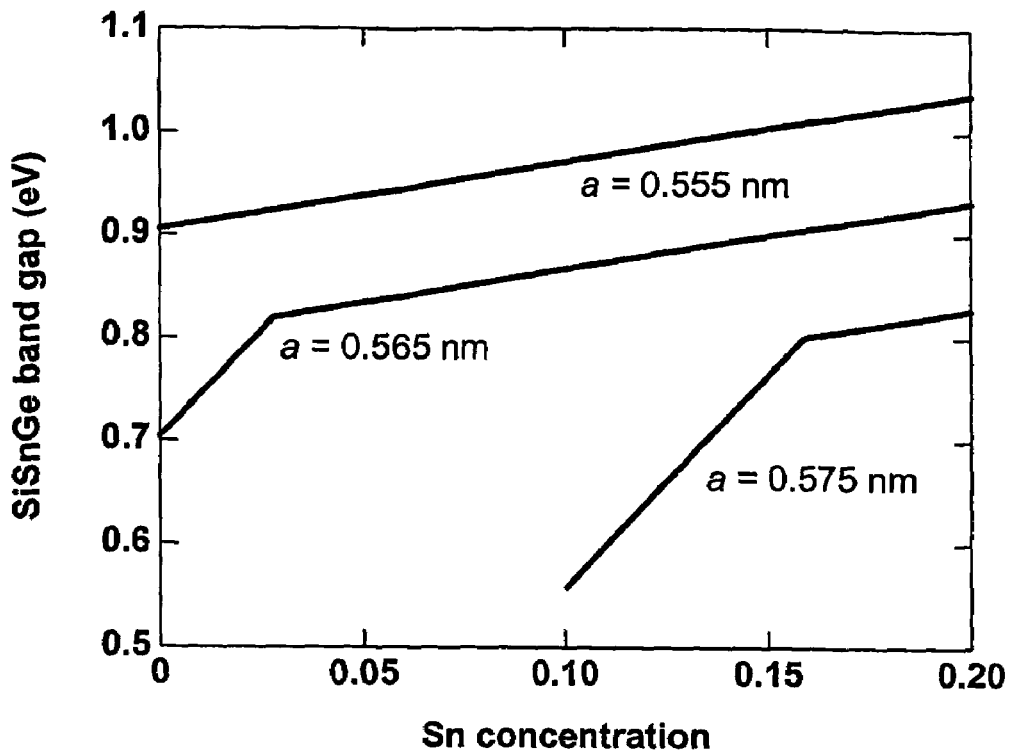
FIG. 6 shows families of band gaps for $Si_xSn_yGe_{1-x-y}$ alloys for which the Sn and Si concentrations are adjusted so that the lattice parameter remains constant. Computed gaps and lattice constants were linearly interpolated between Si, Ge and α-Sn. Notice that we have included only the Sn concentrations achieved so far. An even wider band gap range would be covered with higher Sn-concentrations.

Complementary x-ray diffraction studies confirm single-phase, materials with an average diamond cubic structure. Rocking curves of the SiSnGe (004) reflection give full width at half maxima of 0.25-0.30°. The unit cell parameters obtained from the diffraction data are in close agreement with the theoretical values obtained from first principle simulations (see Table 1). The strain properties of the films have been evaluated by high resolution XRD measurements. Referring to FIGS. 4 and 5 as examples, the data show that we can obtain strained as well as relaxed and lattice-matched $Si_xSn_yGe_{1-x}$ films on strain-free $Sn_{1-y}Ge_y$ buffer layers. This is a unique property of ternary systems that can lead to tunable band gaps over a wide range while keeping the lattice constant unchanged. The possibilities are illustrated in FIG. 6, where we assume a linear interpolation between the lattice constants (Vegard's law) and the electronic energy gaps of Si, Ge, and α-Sn.

Figure 7:
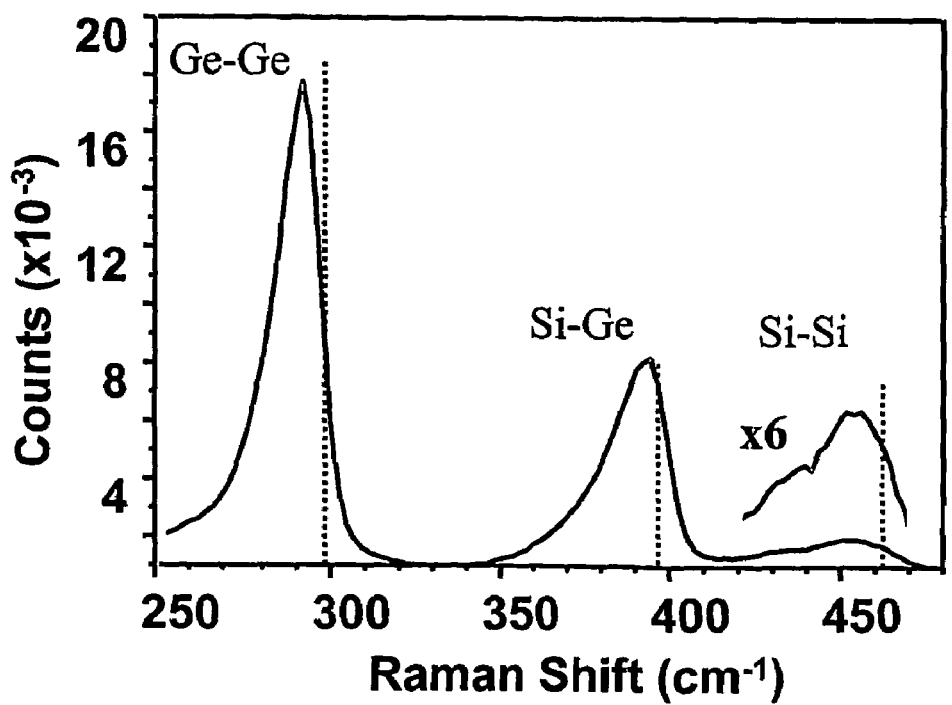
FIG. 7 shows the Raman spectrum of $Si_{0.13}Ge_{0.81}Sn_{0.06}$ showing the Ge—Ge, Si—Ge and Si—Si peaks. The dotted lines represent the expected peal: positions for a film where all the Sn atoms are replaced by Ge atoms. Raman shifts are consistent with the lattice expansion produced by the Sn incorporation into SiGe tetrahedral sites.

The bonding environment of the Si—Ge—Sn alloys was characterized by Raman spectroscopy. FIG. 6 shows the Raman spectrum of a representative $Si_{0.14}Sn_{0.06}Ge_{0.08}$ sample. The spectrum is reminiscent to that of $Si_xGe_{1-x}$ alloys, with three main features that are known in the literature as the "Ge—Ge", "Si—Ge" and "Si—Si" peaks. The similarity with $Si_xGe_{1-x}$ alloys shows that the incorporation of Sn does not alter the relative distribution of Si and Ge atoms in the lattice. No Sn-related vibrations are obvious in the spectra, presumably due to the low Sn-concentration. However, the presence of substitutional Sn is apparent from the measured frequencies of the Raman modes. The dotted lines in FIG. 7 show the expected position of the three main features in $Si_{0.14}Ge_{0.86}$ alloys. See H. K. Shin, D. J. Lockwood, J.-M. Baribeau, Solid State Commun. 114, 505 (2000).

Our measured values are clearly downshifted with respect to the dotted lines, and we can show that this is due to the lattice expansion induced by Sn. Let us consider, for example, the Si—Si "mode." In $Si_xGe_{1-x}$ alloys, its frequency is given by $\omega_{Si—Si}=521-68x$. It has been shown by M. Meléndez-Lira, J. D. Lorentzen, J. Menéndez, W. Windl, N. Cave, R. Liu, J. W. Christiansen, N. D. Theodore, and J. J. Candelaria, Phys. Rev. B 54, 12866 (1997) that this can be written as:

$$\omega_{Si—Si}=521-49x-455\Delta a/a. \quad (1)$$

The second term in Eq. (1) represents the mass disorder contribution, and the third term accounts for the stretching of the Si—Si bond in $Si_xGe_{1-x}$ alloys. See J. Menéndez, in Raman Scattering in Materials Science, edited by W. H. Weber and R. Merlin (Springer, Berlin, 2000), Vol. 42, p. 55. Here $\Delta a$ is the difference between the lattice constant of the alloy and that of Si. Since Ge atoms have very small displacements for Si—Si modes, we assume that their substitution for even heavier Sn atoms does not have any effect on the first term of Eq. (1). Hence the difference between the measured Si—Si frequency and the corresponding dotted line originates entirely from the second term in Eq. (1). If we imagine substituting 6% Ge with 6% Sn, the additional expansion of the lattice is 0.073 Å, which leads to an additional frequency shift of $-7\,cm^{-1}$. This is in very reasonable agreement with the experimental value of $-9\,cm^{-1}$, particularly in view of the approximations made and the fact that Eq. (1) is most accurate for Si-rich alloys. Overall the Raman shifts are consistent with the lattice expansion produced by the Sn incorporation into SiGe tetrahedral sites.

Figure 8:
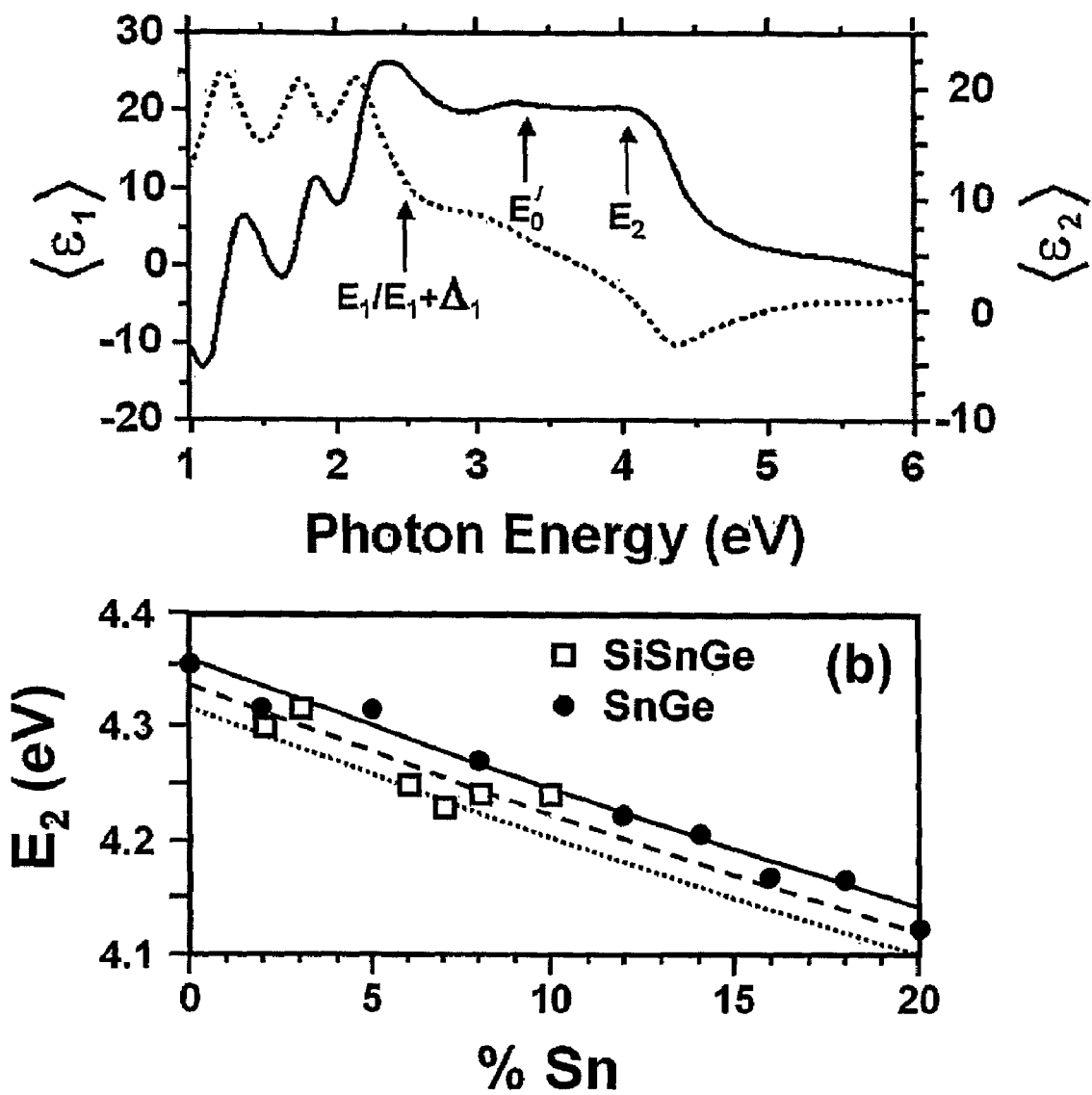
FIG. 8 shows: (a) pseudodielectric function of $Si_{0.20}Sn_{0.02}Ge_{0.78}$ (imaginary part—solid, real part— dashed) Interband critical points are indicated; and (b) $E_2$ critical point energy for $Sn_yGe_{1-y}$ (circles) with a single-parameter fit based on the $E_2$ energies of bulk Ge and Sn and a small negative bowing (solid line). The $E_2$ energies of $Si_xSn_yGe_{1-x-y}$ (squares) show an additional reduction due to incorporation of Si which can be estimated for 10 and 20% Si (dashed, dotted) from the dependence of $E_2$ in $Si_xGe_{1-x}$ (see S. Zollner, in Silicon-Germanium Carbon Alloys: Growth, Properties, and Applications, (Taylor&Francis, New York, 2002), p. 387.

Next, we investigated the electronic band structures of $Si_xSn_yGe_{1-x-y}$ using spectroscopic ellipsometry. As shown in FIG. 8, the pseudodielectric functions of such alloys grown using $Sn_yGe_{1-y}$ buffers on Si are not easy to fit, since this requires a four-layer model (substrate/$Sn_yGe_{1-y}$ buffer/$Si_xSn_yGe_{1-x-y}$/surface overlayer). We solve this problem using the dielectric functions for $Sn_yGe_{1-y}$ determined previously. See C. S. Cook, S. Zollner, M. R. Bauer, P. Aella, J. Kouvetakis, and J. Menendez, Thin Solid Films 455-456, 217-221 (2004), which is incorporated herein by this reference. This leaves only the optical constants of $Si_xSn_yGe_{1-x-y}$ and the thicknesses of the buffer, the ternary alloy, and the surface overlayer (oxide and/or roughness) as parameters.

This procedure yields thicknesses comparable to those obtained by XTEM and reproducible dielectric functions for $Si_xSn_yGe_{1-x-y}$, especially at high photon energies near the $E_2$ critical point where the penetration depth of the light is smaller than the $Si_xSn_yGe_{1-x-y}$ film thickness. The dielectric function of $Si_xSn_yGe_{1-x-y}$ has a similar shape compared to that of Ge or $Sn_yGe_{1-y}$, indicating highly crystalline single-phase quality and semiconducting character as expected for an alloy with cubic crystal symmetry. Using the same derivative technique as Cook, et al., we determine the $E_2$ energies of several $Si_xSn_yGe_{1-x-y}$ samples from the dielectric function. The latter contain peaks related to interband transitions at different regions of the Brillouin zone. For the experimental reasons mentioned above, we focus on the $E_2$ critical point, related to transitions at and near the X-point from the highest valence band to the lowest conduction band. Both Sn and Si reduce $E_2$ compared to Ge (4.36 eV). The variation of $E_2$ in $Sn_yGe_{1-y}$ was determined previously (see Cook et al. and FIG. 8). An additional reduction of $E_2$ is found when adding Si. All $Si_xSn_yGe_{1-x-y}$ samples (squares) display $E_2$ energies below those of $Sn_yGe_{1-y}$ with the same Sn content (i.e., are located below the solid line). To estimate this additional reduction, we calculate $E_2$ of $Si_xSn_yGe_{1-x-y}$ from the values for $Sn_yGe_{1-y}$ and $Si_xGe_{1-x}$ determined earlier (see Cook et al.), assuming the same quadratic bowing for $E_2$ in $Si_xGe_{1-x}$ as for $E_1$. Within this framework, the $E_2$ energies for five different $Si_xSn_yGe_{1-x-y}$ alloys are as expected for 10% and 20% Si. Small deviations from this model can be explained by the uncertainty in the numerical procedure (10-20 meV for $E_2$) and small residual stresses between the ternary alloy and the binary $Sn_yGe_{1-y}$ buffer, which will lead to strain shifts of the critical points.

Experimentally we find that the ternary SiSnGe alloys form more readily and exhibit greater thermal stability than their SnGe counterparts. This may be due to the strain equalization resulting from the opposing effects of the Si and Sn incorporation. These observations prompted us to explore the thermodynamic stability from a theoretical perspective. Accordingly, we investigate the alloys using first principles simulations in a 64-atom supercell representation, e.g., $Si_{13}Sn_5Ge_{46}$ (20.3% Si, 7.8% Sn, and 71.9% Ge) in which the Sn and Si atoms are randomly distributed on a Ge lattice (see Table 1). Shape and volume optimization was carried out while fully relaxing all internal atomic coordinates to an accuracy of 0.001 eV/Å (ultrasoft pseudopotentials were used with $E_{cut}\sim350$ eV and 14 irreducible k-points). Elemental Si, Ge and Sn were calculated using the same procedure yielded the expected perfect diamond lattice symmetry with $a_{Si}=5.3894$ Å, $a_{Ge}=5.6251$ Å and $a_{Sn}=6.4546$ Å, respectively, in good agreement with experimental values ($a_{Si}=5.431$ Å, $a_{Ge}=5.658$ Å and $a_{Sn}=6.493$ Å). Table 1 lists the calculated alloy lattice constants obtained by averaging the three super cell edge lengths (variance<0.004 Å) and the static lattice alloy formation energies $\Delta E=E[Si_xSn_yGe_z]-x\,E[Si]-y\,E[Sn]-z\,E[Ge]$, where $z=1-x-y$. The Gibbs free energy at ambient pressure was approximated as $\Delta G(T;x,y) \sim \Delta E(x,y) - T\Delta S_{mix}(x,y)$ where the last term represents the ideal entropy of mixing. Our results indicate that the low % Sn alloys are thermodynamically stable while the 7-8% Sn alloys are only slightly metastable (n.b., $k_BT$ at 300°~25 meV). The local bonding around Si and Sn sites deviates from ideal (diamond) behavior indicating a significant degree of internal lattice relaxation even though the cell volume remains close to a Vegard law value. The values $a_{LDA}*$ (Table 1) were obtained by scaling the alloy LDA lattice constants such that those calculated for Si, Ge and Sn match experiment. The resulting values agree with experiment to within ~0.01 Å or 0.2% and generally track the variations in composition observed experimentally.

This behavior can also be estimated from available data for the $Si_xGe_{1-x}$ and $Sn_yGe_{1-y}$ binary systems. For $Si_xGe_{1-x}$ the lattice constant is known to behave as $a_{SiGe}(x)=a_{Si}x+a_{Ge}(1-x)+\theta_{SiGe}x(1-x)$ with $\theta_{SiGe}=-0.026$ Å, while a best fit to recent data for $Sn_yGe_{1-y}$ (for % Sn<20%) yields $a_{SnGe}(y)=a_{Sn}y+a_{Ge}(1-y)+\theta_{SnGe}y(1-y)$ with $\theta_{SnGe}=+0.166$ Å. These coefficients can then be combined to yield the formula (LC in Table 1) $a_{SiSnGe}(x,y)=a_{Ge}+\Delta_{SiGe}x+\theta_{SiGe}x(1-x)+\Delta_{SnGe}y+\theta_{SnGe}y(1-y)$ where $\Delta_{SiGe}=a_{Si}-a_{Ge}$ and $\Delta_{SnGe}=a_{Sn}-a_{Ge}$.

Device Applications

The Si—Ge—Sn/GeSn heterostructures have intriguing potential in the areas of sensors emitters, detectors and photovoltaic technologies. One of the drawbacks of Si-based photodetectors is that they cannot cover the optical communication wavelength windows, 1310 nm and 1550 nm. Germanium can barely reach the 1550 nm range, and it doesn't grow well on Si substrates. Therefore, many applications have to use hybrid integration of either GaAs or InP based photodetectors with Si ICs. We have shown an order-of-magnitude increase in absorption at 1550 nm for the $Sn_{0.02}Ge_{0.98}$ buffer layers alone. This suggests that the communications range can be fully accessed by adding small amounts of Sn to Ge. In contrast to pure Ge, this material does grow (with device quality) on Si substrates. Such a direct integration will result in a higher speed performance of the integrated circuits and much lower manufacturing cost. The photovoltaic potential of Si—Ge—Sn alloys is equally interesting. $Sn_xGe_{1-x}$ alloys with as little as x=0.14 would cover more than 95% of the total solar irradiance. The wavelength range covered by $Sn_xGe_{1-x}$ with x≦0.14 also matches the emission range of the best high-performance emitters for thermophotovoltaics, so that applications in this area are also likely.

FIG. 6 implies that $Sn_xSi_yGe_{1-x-y}$ alloys represent an alternative to other lattice matched infrared systems, such as $Hg_xCd_{1-x}Te$ (MCT). A lattice-matched system with variable band gap is ideal for the fabrication of multicolor detectors, which have applications in target discrimination, gas leakage detection, and environmental sensing. In addition, multi-junction photovoltaic cells matched to the source emission spectrum can be engineered. They can lead to dramatic efficiency improvements. Moreover, even though FIG. 6 emphasizes the possibilities of strain-free $Sn_xSi_yGe_{1-x-y}$ alloys, strain can be introduced in a controlled way (unlike the MCT case) by adjusting the Si/Sn ratio in the ternary. This can lead to improved device performance. For example, Auger recombination rates can be manipulated by controlling the heavy-light hole separation in the valence band.

The data presented above reveal that a range of device quality $Si_xSn_yGe_{1-x-y}$ alloys with unprecedented Sn content have been grown and characterized. Ellipsometry analysis of these materials yields dielectric functions as expected for a crystalline alloy with cubic symmetry. Incorporation of Si into SnGe yields an additional reduction of the $E_2$ critical point, as expected based on the $E_2$ values of Si and Ge. High resolution XRD measurements indicate that lattice matched as well as strained $Sn_{1-x}Ge_x/S_{1-x-y}Ge_xSn_y$ heterostructures can be obtained by tuning the lattice constant of the buffer layer and the epilayer. The structure-composition relationship observed agrees well with first principles simulations and exhibits small deviations from Vegard's law behavior. Combined with the previous demonstration of $Ge_{1-x}Sn_x$ films, the new ternary $S_{1-x-y}Ge_xSn_y$ system provides unprecedented flexibility for band gap and strain engineering in group-IV alloys. The fabrication of $Ge_{1-x-y}Si_xSn_y$ makes it possible to decouple strain and band gap engineering to achieve device structures that will lead to novel photonic devices based entirely on group IV materials covering a wide range of operating wavelengths in the IR.

CONCLUSION

The above-described invention possesses numerous advantages as described herein and in the referenced appendices. The invention in its broader aspects is not limited to the specific details, representative devices, and illustrative examples shown and described. Accordingly, departures may be made from such details without departing from the spirit or scope of the general inventive concept.

What is claimed is:

1. A semiconductor structure comprising: a substrate, a $Sn_zGe_{1-z}$ layer formed over the substrate, and an essentially single-phase $Ge_{1-x-y}Si_xSn_y$ layer formed over the $Sn_zGe_{1-z}$ layer.

2. The semiconductor structure of claim 1 wherein the substrate comprises silicon.

3. A method for synthesizing a compound having the molecular formula $H_3Si$—$GeH_3$, the method comprising combining $H_3SiO_3SCF_3$ with $KGeH_3$ under conditions whereby $H_3Si$—$GeH_3$ is obtained.

4. The structure of claim 1, wherein z is about 0.01 to about 0.05.

5. The structure of claim 1, wherein x is about 0.01 to about 0.25; and y is about 0.01 to about 0.11.

6. The structure of claim 1, wherein x is about 0.01 to about 0.25; y is about 0.01 to about 0.11; z is about 0.01 to about 0.05; and the substrate comprises silicon.

7. The structure of claim 1, wherein the $Ge_{1-x-y}Si_xSn_y$ layer is strained.

8. The structure of claim 1, wherein the $Ge_{1-x-y}Si_xSn_y$ layer is relaxed.

9. A method to prepare a semiconductor structure comprising the steps of,
providing a substrate;
depositing a $Sn_zGe_{1-z}$ layer over the substrate; and
depositing an essentially single-phase $Ge_{1-x-y}Si_xSn_y$ layer over the $Sn_zGe_{1-z}$ layer.

10. The method of claim 9, wherein the $Ge_{1-x-y}Si_xSn_y$ layer is deposited by precursor chemical vapor deposition, wherein the precursor chemical vapor comprises $SnD_4$ and $H_3SiGeH_3$.

11. The method of claim 9, wherein the $Sn_zGe_{1-z}$ layer is deposited by precursor chemical vapor deposition, wherein the precursor chemical vapor comprises $SnD_4$ and $Ge_2H_6$.

12. The method of claim 9, wherein the substrate comprises silicon.

13. The method of claim 9, further comprising the step of annealing the $Sn_zGe_{1-z}$ layer prior to depositing the $Ge_{1-x-y}Si_xSn_y$ layer.

14. The method of claim 9, wherein z is about 0.01 to about 0.05.

15. The method of claim 9, wherein x is about 0.01 to about 0.25; and y is about 0.01 to about 0.11.

16. The method of claim 9, wherein x is about 0.01 to about 0.25; y is about 0.01 to about 0.11; z is about 0.01 to about 0.05; and the substrate comprises silicon.

17. The method of claim 9, wherein the $Ge_{1-x-y}Si_xSn_y$ layer is deposited at a temperature of about 310° C. to about 375° C.

18. The method of claim 3, wherein the $H_3SiO_3SCF_3$ and $KGeH_3$ are combined at about −60° C.

19. An alloy of the formula, $Ge_{1-x-y}Si_xSn_y$, wherein x is about 0.01 to about 0.25 and y is about 0.01 to about 0.11.

20. The alloy of claim 19, wherein x is about 0.13 to about 0.20.

21. The alloy of claim 20, wherein y is about 0.07 to about 0.11.

22. The alloy of claim 20, wherein y is about 0.01 to about 0.06.

23. A semiconductor structure comprising: a substrate, a $Sn_zGe_{1-z}$ layer formed over the substrate, and a layer of an alloy of the formula, $Ge_{1-x-y}Si_xSn_y$, wherein x is about 0.01 to about 0.25 and y is about 0.01 to about 0.11 formed over the $Sn_zGe_{1-z}$ layer.

24. The semiconductor structure of claim 23 wherein the substrate comprises silicon.

25. The semiconductor structure of claim 1 wherein the $Sn_zGe_{1-z}$ and $Ge_{1-x-y}Si_xSn_y$ layers are lattice-matched.

26. The semiconductor structure of claim 23 wherein the $Sn_zGe_{1-z}$ and $Ge_{1-x-y}Si_xSn_y$ layers are lattice-matched.

\* \* \* \* \*